(12) United States Patent
Singh et al.

(10) Patent No.: US 6,821,309 B2
(45) Date of Patent: Nov. 23, 2004

(54) CHEMICAL-MECHANICAL POLISHING SLURRY FOR POLISHING OF COPPER OR SILVER FILMS

(75) Inventors: Rajiv K. Singh, Gainesville, FL (US); Seung-Mahn Lee, Gaiensville, FL (US)

(73) Assignee: University of Florida, Gainesville, FL (US)

( * ) Notice: Subject to any disclaimer, the term of this patent is extended or adjusted under 35 U.S.C. 154(b) by 5 days.

(21) Appl. No.: 10/081,979

(22) Filed: Feb. 22, 2002

(65) Prior Publication Data

US 2003/0159362 A1 Aug. 28, 2003

(51) Int. Cl.$^7$ ................................................. C09G 1/00
(52) U.S. Cl. ............................. 51/307; 51/298; 51/293; 106/3; 252/79.1
(58) Field of Search .......................... 51/293, 298, 307, 51/308, 309; 106/3; 438/692, 693; 216/89, 100, 105, 108, 109; 252/79.1

(56) References Cited

U.S. PATENT DOCUMENTS

| | | | | |
|---|---|---|---|---|
| 5,688,366 A | * | 11/1997 | Ichinose et al. | 438/754 |
| 5,700,383 A | * | 12/1997 | Feller et al. | 438/645 |
| 5,770,095 A | * | 6/1998 | Sasaki et al. | 216/38 |
| 5,773,364 A | | 6/1998 | Farkas et al. | |
| 5,863,307 A | | 1/1999 | Zhou et al. | |
| 5,876,508 A | * | 3/1999 | Wu et al. | 134/2 |
| 5,954,997 A | | 9/1999 | Kaufman et al. | |
| 6,001,269 A | | 12/1999 | Sethuraman et al. | |
| 6,063,306 A | | 5/2000 | Kaufman et al. | |
| 6,117,775 A | * | 9/2000 | Kondo et al. | 438/690 |
| 6,126,853 A | | 10/2000 | Kaufman et al. | |
| 6,238,592 B1 | * | 5/2001 | Hardy et al. | 252/79.1 |
| 6,242,351 B1 | | 6/2001 | Li et al. | |
| 6,290,736 B1 | * | 9/2001 | Evans | 51/307 |
| 6,375,545 B1 | * | 4/2002 | Yano et al. | 451/36 |
| 6,383,240 B1 | * | 5/2002 | Nishimoto et al. | 51/307 |
| 6,416,685 B1 | * | 7/2002 | Zhang et al. | 252/79.1 |
| 6,656,369 B2 | | 12/2003 | Krishnan et al. | |
| 6,730,592 B2 | * | 5/2004 | Vaartstra | 438/633 |
| 2002/0098778 A1 | * | 7/2002 | Takashima et al. | 451/36 |
| 2004/0043702 A1 | * | 3/2004 | Singh | 451/36 |

FOREIGN PATENT DOCUMENTS

| | | | | |
|---|---|---|---|---|
| EP | 0 913 442 A2 | 6/1999 | | C09G/1/02 |
| WO | WO 00/24842 | * | 5/2000 | |

OTHER PUBLICATIONS

Stöber, W., et al. "Controlled Growth of Monodisperse Silica Spheres in the Micron Size Range", Journal of Colloid and Interface Science, vol. 26 (1968), pp. 62–69, no month.

Rosen, M.J., "Surfactants and Interfacial Phenomena"John Wiley & Sons, 1989, pp. 3–32, 52–54, 70–80, 122–132 and 398–401; and, no month.

Singh, R.K., et al., Chemical–Mechanical Polishing 2000–Fundamentals and Materials Issues, vol. 613, 2000, pp. E7.8.1–E7.8.6., no month.

* cited by examiner

Primary Examiner—Michael Marcheschi
(74) Attorney, Agent, or Firm—Akerman Senterfitt

(57) ABSTRACT

A slurry for chemical mechanical polishing (CMP) of a copper or silver containing film provides at least one reactant for reacting with the copper or silver film to form a soft layer on the surface of the copper or silver film. The soft layer has a hardness less than the copper or silver film. The slurry preferably includes either no particles or particles which are softer than the copper or silver layer. A method for chemical mechanical polishing (CMP) a copper or silver containing film includes the steps of providing a slurry for reacting with the copper or silver film to form a soft layer on the surface of the copper or silver film and uses either no particles or particles softer than the copper or silver film, applying the slurry to the copper or silver film to form the soft layer, and removing the soft layer using a polishing pad.

23 Claims, 16 Drawing Sheets

(a)
(b)
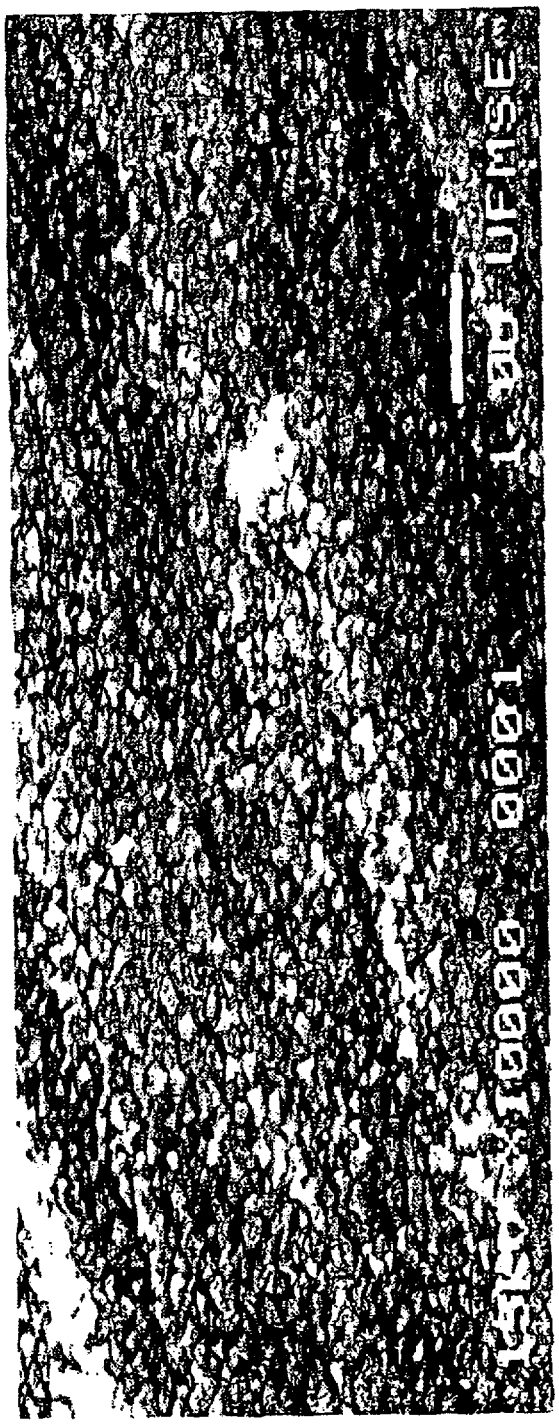
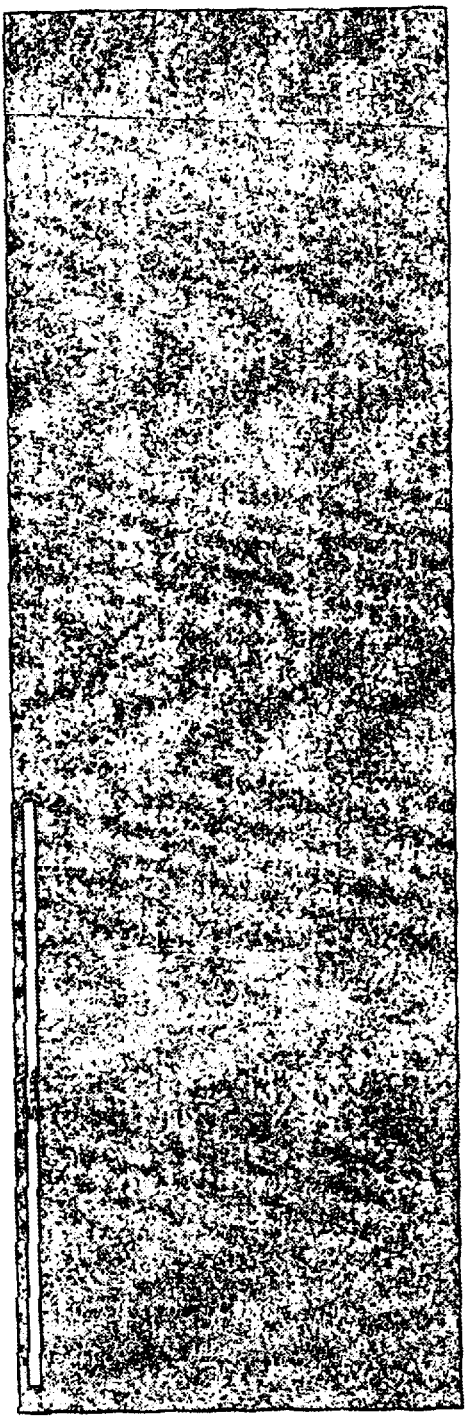
FIG. 5

|  | Concentration of iodine (N) | | |
| --- | --- | --- | --- |
|  | 0.001 | 0.01 | 0.1 |
| Removal Rate (nm/min) | 53 | 775.0 | 2716 |
| Selectivity with Cu/Ta | 530 | >4500 | >5000 |
| RMS (nm) | 1.06 | 1.98 | 2.13 |
| Scratches #/cm$^2$ | <5 | <5 | <5 |

FIG. 7

|  | Concentration of Hydrogen Peroxide (%) | | |
| --- | --- | --- | --- |
|  | 0.1% | 1% | 10% |
| Removal Rate (nm/min) | 5 | 27 | 6 |
| RMS (nm) | 4.2 | 5.1 | - |

FIG. 8

| Pressure | 2.7 psi | 4.3 psi | 6.7 psi |
|---|---|---|---|
| Removal Rate (nm/min) | 298 | 335 | 425 |
| Selectivity Cu/Ta | >3000 | >3000 | >3000 |
| Surface Roughness (nm) | 1.06 | 1.4 | 2.0 |
| Scratches (#cm$^2$) | <5 | <5 | <5 |

FIG. 9

|  | 0.01 N iodine | | | | |
|---|---|---|---|---|---|
|  | pH 4 | pH 6 | pH 8 | pH 10 | pH 12 |
| Removal Rate (nm/min) | 1210 | 909 | 1023 | 756 | 23 |
| Selectivity (Ta) | 4000 | >4000 | >4000 | >3000 | >200 |

FIG. 10

|  | Concentration of Particles | | |
| --- | --- | --- | --- |
|  | No particle | 1 wt.% | 5 wt.% |
| Removal Rate (nm/min) | 71 | 114 | 151 |
| Selectivity | >1000 | >200 | >200 |

FIG. 11

Effect of small amount of silica in iodine based solution

| | Concentration of silica particle | | | |
|---|---|---|---|---|
| | No particle | 0.01 wt.% | 0.1 wt.% | 1 wt% |
| Removal Rate (nm/min) | 50.4 | 80.2 | 153.6 | 333.5 |
| Selectivity on Cu/Ta | 7200 | 529 | 13 | 8.0 |
| Scratches (#/cm$^2$) | 0 | 0 | 1-2 | 5 |

FIG. 12

The effect of inhibitors in iodine solution (pH 4 and 2.7 psi)

| | 0.01 N I$_2$ | | | | | | |
|---|---|---|---|---|---|---|---|
| | No inhibitor | BTA | | | TTA | | |
| | | 1 mM | 5 mM | 10 mM | 1 mM | 5 mM | 10 mM |
| Removal Rate (nm/min) | 775.0 | 945.1 | 56.3 | 58.4 | 100.1 | 106.9 | 51.8 |
| STD | 7.6 | 14.9 | 16.6 | 16.2 | 27.2 | 13.2 | 7.3 |

The effect of surfactants on removal rate (nm/min) of copper in iodine solution (pH 4 and 6.7 psi)

| | 10 mN I$_2$ | | | | | | | | |
|---|---|---|---|---|---|---|---|---|---|
| | No inhibitor | SAS | | | | | Triton X-100 | | |
| | | .5 mM | 2 mM | 5 mM | 10mM | 20 mM | 1 mM | 2 mM | 3 mM | 5 mM |
| RR (nm/min) | 1210.0 | 1080.9 | 1040.0 | 975.7 | 524.7 | 514.0 | 977.5 | 189.0 | 129.7 | 29.5 |
| STD | 33.5 | 55.1 | 11.6 | 62.5 | 34.1 | 11.5 | 43.4 | 30.4 | 21.2 | 24.2 |

The static removal rate (nm/min) of copper in iodine based solutions (pH 4)

| | | 10 mN iodine | | |
|---|---|---|---|---|
| | | No additive | 5 mM BTA | 10 mM SAS |
| pH | 4 | 64.9 ± 2.65 | 2.8 ± 0.4 | 39.6 ± 4.3 |
| | 6 | 63.4 ± 2.37 | 1.1 ± 0.4 | 65.2 ± 10.1 |
| | 8 | 48.7 ± 2.4 | -1.4 ± 0.7 | 28.9 ± 0.4 |
| | 9 | 35.2 ± 1.3 | -0.3 ± 0.5 | 27.7 ± 0.4 |

FIG. 13

|  | 0.01 N $I_2$, 10 mM TTA | | | | |
|---|---|---|---|---|---|
|  | No salt | KI | | NH$_4$Cl | |
|  |  | 0.001 M | 0.01 M | 0.01 M | 0.1 M |
| Removal Rate (nm/min) | 52 | 66 | 92 | 34 | 32 |

FIG. 14

Effect of succinic acid/citric acid added in 10 mN Iodine and 5 mM BTA/TTA on CMP performance

|  | $10^{-2}$ N $I_2$, 5 mM BTA | | $10^{-2}$ N $I_2$, 5 mM TTA | | $10^{-2}$ N $I_2$, 5 mM BTA | |
|---|---|---|---|---|---|---|
|  | Succinic Acid | | Succinic Acid | | Citric Acid | |
|  | 0.1 M | 0.2 M | 0.1 M | 0.2 M | 0.1 M | 0.2 M |
| Removal Rate (nm/min) | 33.5 | 37.4 | 36.6 | 47.0 | 295.1 | 432.5 |
| STD | 12.5 | 1.9 | 10.9 | 6.1 | 26.6 | 5.0 |
| SRR (nm/min) | 3.2 | 3.9 | 2.7 | 3.1 | 11.7 | 18.3 |

FIG. 15

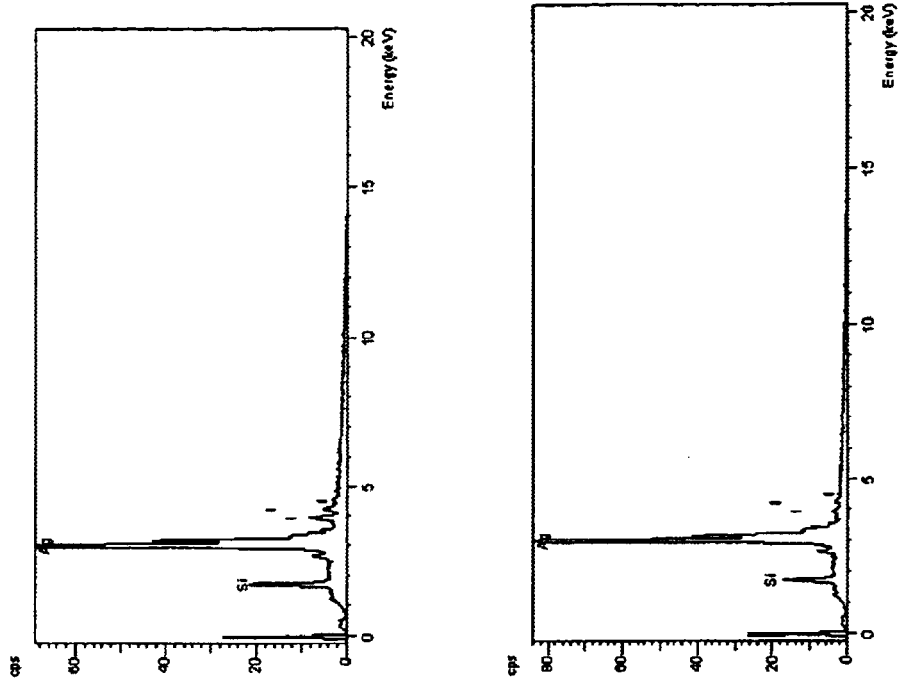
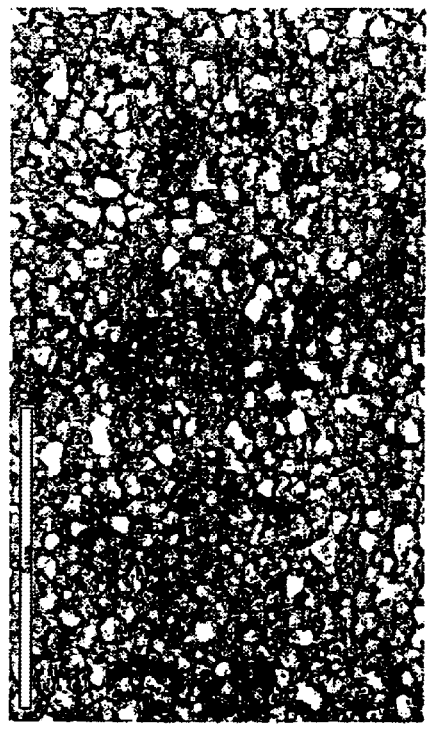
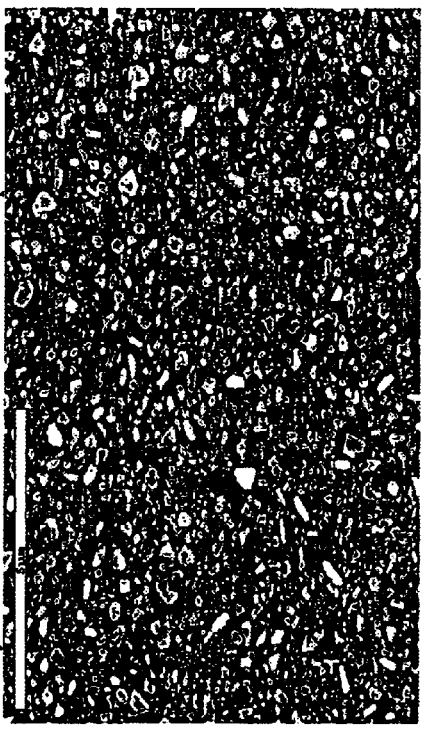
SEM (x10k) pictures and ES of AgI
Slurry chemistry: 10 mN iodine at pH4 (a)
Slurry Chemistry: 10 mN iodine and 20 mM BTA at pH4 (b)
FIG. 16

CHEMICAL-MECHANICAL POLISHING SLURRY FOR POLISHING OF COPPER OR SILVER FILMS

STATEMENT REGARDING FEDERALLY SPONSORED RESEARCH OR DEVELOPMENT

Not applicable

FIELD OF THE INVENTION

This invention relates to a slurry and method for chemical-mechanical polishing of a copper or silver containing film.

BACKGROUND

Reductions in semiconductor device dimensions provide higher densities and improved performance for integrated circuits. In many integrated electronic devices, millions of discrete elements, such as transistors, resistors and capacitors, are interconnected. Due to an increase in device density provided by scaling of semiconductor processes to improve circuit performance, it is no longer generally possible to utilize a single metal interconnect level. Single level interconnects result in significant parasitic resistance which can adversely affect device performance, particularly the dynamic performance of the integrated circuit.

Copper has become an increasingly popular choice for interconnect metal and has begun replacing aluminum in certain applications. Copper is much more conductive than aluminum, allowing finer wires having lower resistive losses. Copper is also significantly less vulnerable to electromigration than aluminum and less likely to fracture under stress. Electromigration is the drift of metal atoms when a conductor carries high current densities, and can create reliability problems through generation of voids and other defects.

Although, copper provides advantages over aluminum, it has at least one major disadvantage. Copper is poisonous to silicon since it readily diffuses into silicon and causes deep-level defects. Therefore, copper must be isolated from silicon, usually through use of a suitable barrier layer.

Multilevel metallization structures have been developed which include an interconnection structure having several levels of metallization separated by thin insulating layers. Metal plugs are used to connect the different metal levels to one another. Presently, aluminum alloys (e.g. Al/Si/Cu) are still commonly used for the metal interconnect, while tungsten is generally used for plug structures as the material of choice for interconnecting two levels of metals. Aluminum and its alloys are generally dry etched, such as reactive ion etching and plasma etching. However, dry etching of copper is not currently feasible. Accordingly, when copper and its alloys are used instead of conventional aluminum or aluminum alloys as an interconnection material, alternative techniques are employed to define the copper lines.

For example, a damascene process together with chemical-mechanical polishing (CPM) can be used to define copper lines. In a damascene process, trenches are etched in a dielectric material, such as silicon dioxide ($SiO_2$). A barrier material is then deposited, generally by sputtering. Copper is then deposited typically using electrodeposition techniques (e.g. electroplating) to fill the barrier lined trenches. In the case of electrodeposition of copper onto a silicon wafer, the wafer is typically coated with a thin conductive layer of copper (seed layer) to produce electrically conductive surfaces before being immersed in a solution containing cupric ions. The copper seed layer is preferably extremely thin, but must still be continuous across all features on the wafer surface to maximize deposition of copper on via sidewalls while minimizing the layer thickness on the bottom of the features and on the field of the wafer. The copper film is then removed by CMP to define the copper lines.

CMP combines both chemical action and mechanical forces and is commonly used to remove metal deposits in damascene processes, remove excess oxide in shallow trench isolation steps, and to reduce topography across a dielectric region. Components required for CMP include a chemically reactive liquid medium and a polishing surface to provide the mechanical control required to achieve planarity. Either the liquid or the polishing surface may contain nano-size inorganic particles to enhance the reactive and mechanical activity of the process. CMP is the only technique currently known for producing die level flatness required for sub 0.5 μm devices and is considered a requirement for the production of sub 0.2 μm device structures and state-of-the-art metal interconnect schemes.

Metals can also be used to form the gate electrode of certain devices. In this case, the metal gate provides the electrical pathway for switching the device. In the case of a MOS transistor, the gate dielectric is typically silicon dioxide while the typical gate electrodes presently used are formed from heavily doped polysilicon. Alternative gate dielectrics having improved properties may soon replace $SiO_2$. For example, novel high dielectric constant materials such as yttria stabilized zirconia (YSZ), hafnia, lanthanum oxide, and certain silicates are expected to find increasing use for future high performance applications. To use these gate dielectrics more efficiently, gate electrode materials such as Ta, Cu, and Pt may also become used.

Other possible metallic materials may include Os, Ru, TiN, TaSiN, $IrO_2$, $RuO_2$ and other conducting oxides such as tin oxide ($SnO_2$), indium tin oxide, and related mixtures and alloys. Copper may be deposited on top of these material systems. Besides the use of copper in interconnects for CMOS devices and gate structures in high dielectric constant materials, there may be number of emerging applications such as ferroelectric random access memory devices (FeRAM), tunneling magnetoresistance (TMR) or giant magnetoresistance (GMR) devices where copper is deposited on a metal or a dielectric structure. In a FeRAM, copper may be used as the interconnecting metal or as sandwich metal layer on a gate electrode system. In a TMR or a GMR device, copper can be used as a back terminal, front end terminal or an electrode on a multilayer magnetic/non-magnetic structure. To create these specific structures it is also essential to remove copper selectively from the surface, but not remove the underlying dielectric or metallic material. Other examples of possible uses of copper may lie in the integration of MRAM (magnetic random access memory) devices for non-volatile storage.

In the future, copper may be replaced by silver. Silver has higher electrical conductivity as compared to copper, and should provide comparable electromigration resistance which makes it ideal for interconnect and related applications. The electromigration capability of silver has been shown to improve significantly when the silver layer is encapsulated with a thin film.

FIG. 1 shows a schematic view of the steps in a copper damascene CMP process. A low dielectric constant material disposed on a silicon wafer is patterned by suitable etching to form a plurality of trenches 110 as shown in FIG. 1(a). A diffusion barrier layer 120, such as Ti, Ta or TaN, is then applied to cover the wafer surface, including the trenches 110 as shown in FIG. 1(b). A copper or copper alloy layer 130 is then deposited, by a method such as electroplating. (FIG. 1(c)). The copper or copper alloy layer is isolated from the remainder of the circuit by the barrier layer 120. Copper disposed over dielectric plateaus is commonly referred to as overburden metal 131.

A CMP process can then be used to define the copper layer through an essentially planar removal process. The CMP process proceeds to remove the copper layer sufficient to remove the overburden portion 131 to expose the barrier layer in the overburden regions 131 to produce the structure 140 which is shown in FIG. 1(d). A second CMP step, generally using a different slurry solution as compared to the copper CMP process, is then used to polish the barrier layer and produce the completed structure 150 which is shown in FIG. 1(e). This process can be repeated to produce multiple copper or other conductor levels to form a plurality of interconnect or other levels.

FIG. 2 shows a schematic view of a CMOS transistor 200 having a metal gate formed from a damascene/CMP process. Transistor 200 is shown following CMP polishing of a gate metal, such as Cu, Pt, Os, Ir, $IrO_2$, Ru, $RuO_2$ or Ta, using a damascene/CMP process analogous to the copper interconnect process discussed above. Transistor 200 includes silicon substrate 201, the transistor having a source 202 and a drain 203. The source 202 and drain 203 have lightly doped extensions made possible in previous processing by spacer 204 and 205. A gate aperture is provided in field oxide 208 to reach the silicon substrate 201. A thin gate oxide 218 is disposed on top of silicon substrate 201. Barrier layer 212 is then disposed over gate oxide 218 and on the sidewalls of the gate aperture provided by spacers 204 and 205. Gate metal 215 fills the gate aperture volume and is disposed over barrier layer 212.

Whether an interconnect or a gate electrode is formed using CMP, it is important to stop the CMP process soon after the metal layer is fully removed to minimize removal of underlying layers. Since metal thickness and polishing rates can be non-uniform across the wafer area, it is also helpful for the CMP process to provide a low polishing rate of the underlying layers below the metal relative to the metal removal rate.

A diagram of a conventional CMP polisher 300 is shown in FIG. 3. The CMP polisher includes a polishing pad 310 disposed on a platen 320 which rotates. A wafer 330 is pressed into direct contact with the polishing pad by a force exerting structure 350. A slurry solution is provided by a slurry feed 340 to wet the polishing pad 310 which chemically and physically interacts with the surface of the wafer 330.

Conventional slurries used for the CMP of copper include a solid abrasive and an oxidizing substance. Typically, CMP polishing slurries contain a plurality of alumina or silica particles suspended in an oxidizing aqueous medium. In the case of copper CMP, a wafer containing a copper or a copper alloy surface is mechanically rubbed by a polymeric pad. In FIG. 3, the polishing pad 310 is attached to the bottom of the rotating platen 320, while the wafer 330 is brought in contact with the pad 310 from the top. The wafer 330 can either be rotated or kept stationary. The wafer 330 can be moved in a circular, elliptical or in a linear manner with respect to the polishing pad 310. The pressure on the wafer 330 is generally varied from 0.1 psi to 10 psi, and the rotation speed of the platen 320 is generally varied from 0 rpm to 300 rpm.

The polymeric pad 310 supplies the mechanical component for the polishing process. The harder the polymeric pad 310, the higher the localized shear stress on the surface of the wafer. However the contact area on the surface will decrease when a harder pad is employed in the process. Typical pads which are commonly used include IC1000 CMP pads manufactured by Rodel Corporation, located in Newark, Del.

The diameter of the platen wheels can vary from 6 to 45 inches, while the size of the wafer can vary from 1 to 12 inches in diameter. In general, larger platen wheels produce more uniform polishing results. To maintain a fixed linear velocity, either the angular velocity can be increased or the radius of the wafer from the center can be increased. It is generally important to generate a linear movement of the pad across the wafer.

The copper polishing rate is known to increase with increasing pressure and velocity. However, high pressure and velocity can also increase the size and density of scratches induced by the CMP process.

The polishing solution can be fed directly near the surface of the wafer or can be fed to the polishing area from the underside of the platen. It is important to ensure that the distribution of the slurry is uniform across the wafer. The surface of the wafer should be also be as flat as possible.

To ensure that the underlying layers are not substantially removed in the CMP process, the rate of removal of the copper (or other metal) layer with respect to the underlying dielectric layer should be very high. The underlying dielectric layer is generally a silicon dioxide or a low dielectric constant layer which provides a dielectric constant less than 4.0. This ratio of polishing rates is called selectivity and depends primarily on the composition of the slurry.

Also, due to initial non-uniformities on the wafer surface, the overburden metal will be completely polished off at different times at different locations on the wafer. High slurry selectivity allows copper on all locations on the wafer to be completely removed with no residuals of copper remaining, and without significantly removing the under-layer material.

It is also important for the CMP process to keep the surface defectivity of the copper and other layers as low as possible. Surface defectivity includes scratches, surface roughness and adhering particles on the wafer surface.

The oxidizing substance included in the slurry is typically hydrogen peroxide. Oxidizing substances form a thin abradable copper oxide ($Cu_2O$) layer that is removed by the abrasive particles in the slurry by action of the polishing pad. The sizes of the alumina and silica abrasive particles typically range from 50 nm to 500 nm. U.S. Pat. Nos. 6,063,306, 5,954,997 and 6,126,853 to Kaufmann, et. al., describe the use of specific slurries which contain abrasives such as silica/alumina, hydrogen peroxide based oxidizer, and other complexing and softening agents such as organic amino acids to polish copper and copper/tantalum based structures. When copper interconnects and plugs are formed by CMP using conventional slurries based on abrasives, several problems generally result. Surface morphology inhomogenities such as dishing and erosion can result from copper CMP. Dishing occurs when the surface of the central part of the metal interconnection inlaid in the groove formed in the insulating film is polished excessively compared to the edge. This effect is typically exacerbated for large features, such as 50 μm or greater metal lines and pitches of metal and dielectric layers in damascene technology.

Erosion occurs primarily in thin line structures when both the dielectric and copper are removed. Erosion typically occurs when the rates of the removal of the two adjacent layers are different. The use of hard abrasives such as alumina and silica further exacerbates this problem. Conventional slurries based on abrasive particles typically suffer from both of these problems.

Use of an oxidizer such as hydrogen peroxide in a copper CMP slurry forms a thin copper oxide ($Cu_2O$; known as cuprite) layer on the copper or copper alloy surface. Copper oxide is an oxide whose hardness on the Mohs scale is greater than copper. The Mohs scale is a hardness scale having a range from 1 to 10, with 10 being the hardest material (diamonds). Cuprite has a Mohs hardness of 3.5 to 4, while the underlying copper layer has a Mohs hardness of from 2.5 to 3. Under certain conditions, copper 11 oxide (CuO), (also known as tenorite) may be formed instead of, or in addition to $CU_2O$. CuO also has a hardness of 3.0 to 4. Thus, both CuO and $Cu_2O$ have a hardness greater than copper.

The hardness of the respective materials in thin film form can be measured accurately by using nano-indentation measurements. Examples of nano-indentation measurements equipment include Nanoindentor instruments provided by Hysitron Inc., located in Minneapolis, Minn.

To remove the cuprite or a copper (II) oxide layer, abrasive particles, such as alumina (Mohs hardness of 8.5) are provided in the slurry. Abrasives generally have a greater hardness than insulating layers such as silicon dioxide (Mohs hardness of approximately 5 to 7), and thus can cause scratching of the insulating layer. Scratches can decrease circuit yield and also degrade circuit reliability.

The stress between the abrasive and wafer contact can be quite high because of the hardness of the abrasive particles used. The stresses can cause delamination of copper or its underlying barrier layer (e.g. tantalum) from silicon dioxide or other low dielectric constant layers.

Hard abrasives used for polishing copper generally do not allow adequate stopping of the polishing process once the copper overburden layer has been removed. Typically, underneath the copper layer is a barrier layer of tantalum, tantalum nitride, titanium nitride or tungsten nitride. Since the typical alumina abrasive used in copper polishing is relatively harder than the barrier layer, it can also partially remove the protective barrier layer. Thus, the use of hard abrasives such as silica, alumina, zirconia and ceria whose hardness is greater than the hardness of copper, are not suitable for an optimized CMP of copper.

The polishing rate across the surface of the copper is also generally uneven. Thus, finite polishing of the underlying layer results in non-planarity of the surface because at some places on the wafer a part of the underlying barrier layer or the dielectric is removed. This non-planarity can be further exacerbated by the formation of a thick copper oxide layer because of the differences in the initial surface profile of copper, and also the microstructural variations in copper layer.

Static etching of copper, which is chemical etching without mechanical assistance from the polishing pad, can also cause problems in certain slurries. To soften the effect of abrasives, approaches have been developed which reduce the amount of particle loading in the polishing slurry. To compensate for the reduced mechanical removal rate due to less particles, these slurries generally contain chemical additives that can etch the surface of the copper. The static copper etching rate can be quite high. In a typical CMP operation, the static etch rate should be less than 2 to 5% of the CMP polishing rate, or approximately 5 to 20 nm/min.

However, if a slurry solution includes a high concentration of etchants, the static etch rate can be higher than noted above. High static etch rates can result in the undesirable formation of substantially non-planar surfaces since static etching results in isotropic material removal.

The problems noted above occur because of the presence of hard abrasive particles which can scratch or dent the surface of softer materials, such as copper or soft insulating materials, such as $SiO_2$ or other low dielectric constant (low K) materials. A low K dielectric material can be defined as a material which has a dielectric constant less than silicon dioxide (4.0).

The quality of CMP polishing processes for copper could be enhanced by reducing the concentration of the abrasive. For example, it may be possible to polish the surface of copper with a slurry having etchants along with a low concentration of abrasive particles. However, this method cannot generally provide the necessary planarization and anisotropic removal of material.

An alternative method involves forming a passive surface layer such as copper oxide, which can be etched by a solution while mechanically rubbing with a pad. However, copper oxides, such as $Cu_2O$ and CuO are materials which are significantly harder than copper or most insulating layers. As a result, hard particles generally are required to remove copper oxide which can damage or peel the softer exposed or adjacent layers and typical produce significant surface non-uniformities.

Slurry additives, such as those disclosed in EP 0913442A2 to Hitachi Chemicals, can be used to soften the surface copper oxide layer to facilitate removal by mechanically aided etching also presents problems. First, this is equivalent to etching of the copper surface in which the copper species is removed in a dissolved form. This process can lead to high static removal rate of copper (>5%), a problem which should generally be avoided.

Moreover, if the etching rate is decreased, the removal rate of copper is reduced. The mechanical action serves to enhance the etching rate by removal of surface passivating layer from the surface. If the etching chemicals are reduced, the polishing rates becomes sub-optimal. In the etching of the surface oxide layer, the etching rate is dependent on the transport of the chemicals, thus may lead to non-uniformities at the surface, which is also undesirable. Thus, copper CMP through the formation, softening and etching/removal of a copper oxide layer, including variants thereof, do not represent an ideal solution for copper removal.

SUMMARY OF THE INVENTION

A slurry for chemical-mechanical polishing (CMP) of a copper or silver containing film provides at least one reagent for reacting with the film to form a soft layer on the surface of the copper or silver film. The soft layer has a hardness less than the copper or silver film. In conventional copper CMP, cuprite ($CU_2O$) and/or copper II oxide (CuO) are formed on the copper surface. Cuprite or copper II oxide have a hardness greater than that of copper.

The soft layer can be a copper or silver halide, such as copper iodide (CuI) or silver iodide (AgI). A plurality of particles can be added to the slurry. The particles are preferably softer than the copper film and can be selected from polymers and nano-porous particles. For example, soft particles can be polystyrene, polytetrafluoroethylene, polyamide, silver or porous silica particles.

Particles can also be abrasive particles, having a hardness greater than that of copper, provided they are provided in a sufficiently low concentration, preferably being less than 1 wt. %. Abrasive particles can be silica, alumina, zirconia, carbon or yttria particles.

The slurry can include iodine, bromine, fluorine, HI, $KIO_3$, sulfuric acid, hydrochloric acid or carbonic acid to provide desired reagents for formation of the soft layer. Reactants may be formed either directly or indirectly using appropriate chemicals.

The soft layer can be copper bromide, copper fluoride, copper chloride, copper carbonate, copper sulfate or copper nitrate or any of these layers mixed with an oxide layer. The thickness of the soft layer is preferably less than about 1 $\mu$m, and most preferably less than about 0.2 $\mu$m. The soft layer is preferably substantially insoluble in the slurry. As used herein, substantially insoluble refers to a chemical etch rate of less than 20 nm/min.

The pH of the slurry can be from 2 to 12. Preferably, The pH of the slurry is from 2 to 9.

The slurry can include an etchant for removing a copper oxide or carbon containing film disposed on or in the copper film. The etchant can be an acid. The acid can be nitric acid, acetic acid, sulfuric acid, hydroxy acid, hydrochloric acid, hydrofluoric acid, carboxylic acid, citric acid, malic acid, malonic acid, succinic acid, phtalic acid, tartaric acid, dihydroxysuccinic acid, lactic acid, malic acid, fumaric acid, adipic acid, glutaric acid, oxalic acid, benzoic acid, propionic acid, butyric acid, ethylenediamminetetraacetate ion (EDTA) or valeric acid.

In an alternate embodiment of the invention, a chemical etching step using etchants such as those listed above can be used before initiating CMP. The chemical etching step can remove contamination on the copper or silver surface such as "native oxide", prior to initiating polishing.

The slurry can include a passivating additive. The passivating additive can be benzotriazole (BTA) or tolytriazole (TTA). The concentration of the passivating additive can be from 0.0001 mM to 300 mM.

The slurry can include at least one salt. The salt can be KI, $KBr$, $KCO_3$, $KCl$, $NH_4I$ or $NH_4Cl$.

To modify the reaction rate kinetics on the surface, chelating agents may be used. Examples of some chelating agents include EDTA, and bidentate ligands such as ethylenediamine (en), aceylacetonate ion (acac), phenanthroline (phen), andoxalates and related compounds.

The selectivity of the CMP process using the slurry can be at least 100, or at least 200 for removal of a copper or silver film relative to a tantalum, titanium or other refractory metal based barrier layer and at least 50, at least 80, at least 100, or at least 200 for the removal of the copper or silver film relative to a silicon dioxide, alumina or low K dielectric layer. Preferably, the metal (e.g. Cu/Ta or Ag/Ta and Cu or Ag) film selectivities relative to a silicon dioxide (or other low K dielectric) layer are each at least 500.

The slurry may include at least one surfactant. The surfactant can be a non-ionic, anioninic, cationic or zwitterionic surfactant. The surfactant may also be amphoteric.

The slurry may contain one or more polymer additives. For example, polyethylene oxide (PEO), polyacrylic acid (PAA), polycryamide (PAM), polyvinylalcohol (PVA), polyalkylamine (PAH) may be used.

A method for chemical mechanical polishing (CMP) of a copper containing film includes the steps of providing a slurry which reacts with the copper film to form a soft layer on a surface of the copper film. The soft layer has a hardness less than the copper film. The slurry solution is applied to the copper film to form the soft layer. The soft layer is removed using a polishing pad. The removing step preferably applies a nominal shear force greater than an interface strength of an interface between the soft layer formed and the copper or silver film. The nominal shear stress can be greater than about 0.1 psi, greater than about 0.5 psi or greater than about 1.0 psi.

BRIEF DESCRIPTION OF THE DRAWINGS

A fuller understanding of the present invention and the features and benefits thereof will be accomplished upon review of the following detailed description together with the accompanying drawings, in which:

FIGS. 5(a) and 5(b) illustrate SEM micrographs of the copper surface after a copper coated silicon wafer was dipped in solutions containing iodine having no BTA and 10 mM BTA, respectively.

FIG. 7 is a table of copper film CMP removal results from a slurry without abrasive particles, as a function of the concentration of iodine in a solution.

FIG. 8 is a table of CMP removal results for a copper film from a slurry without abrasive particles when hydrogen peroxide in varying concentrations was added.

FIG. 9 is a table of the effect of pressure on the CMP removal results of a copper film.

FIG. 10 is a table of the effect of varying pH on CMP removal of a copper film using an iodine containing slurry.

FIG. 11 is a table of copper CMP removal results produced by a slurry which includes polymeric particles.

FIG. 12 is a table of copper CMP removal results produced by a slurry which includes abrasive silica particles.

FIGS. 13(a) and (b) are tables showing the copper CMP removal rate of a slurry which includes an inhibitor and a surfactant, respectively.

FIG. 13(c) is a table showing the static copper CMP removal rate of a slurry with no inhibitor or surfactant, with an inhibitor, and with a surfactant, respectively, as a function of pH.

FIG. 14 is a table showing copper CMP polishing characteristics of a slurry which includes various salts such as $NH_4Cl$ and KI.

FIG. 15 is a table showing copper CMP polishing characteristics resulting from the addition of weak acids to the slurry.

FIG. 16(a) includes a SEM and EDX showing the formation of a silver iodide layer after dipping a silver coated wafer in an iodine containing slurry without BTA.

FIG. 16(b) includes a SEM and EDX showing the formation of a silver iodide layer after dipping a silver coated wafer in an iodine containing slurry, with a BTA additive.

DETAILED DESCRIPTION OF THE PREFERRED EMBODIMENTS

Figure 1:
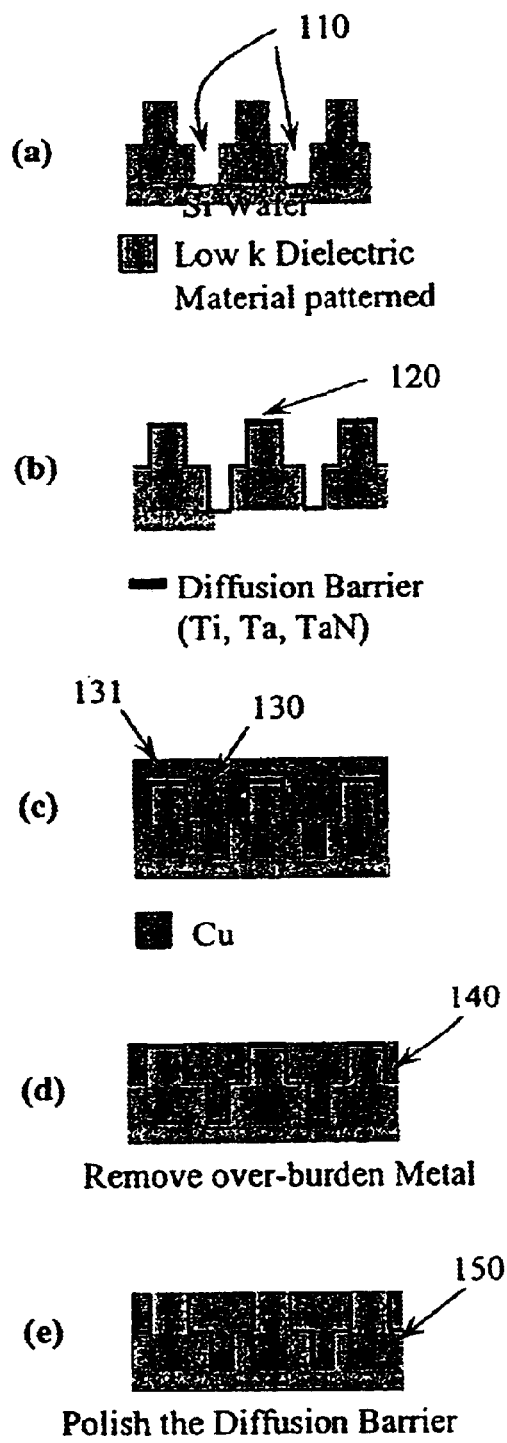
FIGS. 1(a)–(e) shows cross sectional views after various seciuential steps in a copper damascene/CMP process: a patterned low dielectric constant material disposed on a silicon wafer to form a plurality of trenches is shown in FIG. 1(a): a diffusion barrier layer covering the wafer surface, including the trenches is shown in FIG. 2(b); a copper or copper alloy layer deposited thereon is shown in FIG. 1(c) and the structure shown in FIG. 1(c) having the overburden portion removed by first CMIP step to expose the barrier layer in the overburden regions is shown in FIG. 1(d): a second CMP step then polishes the barrier layer and produces the completed structure shown in FIG. 1(e).
Figure 2:
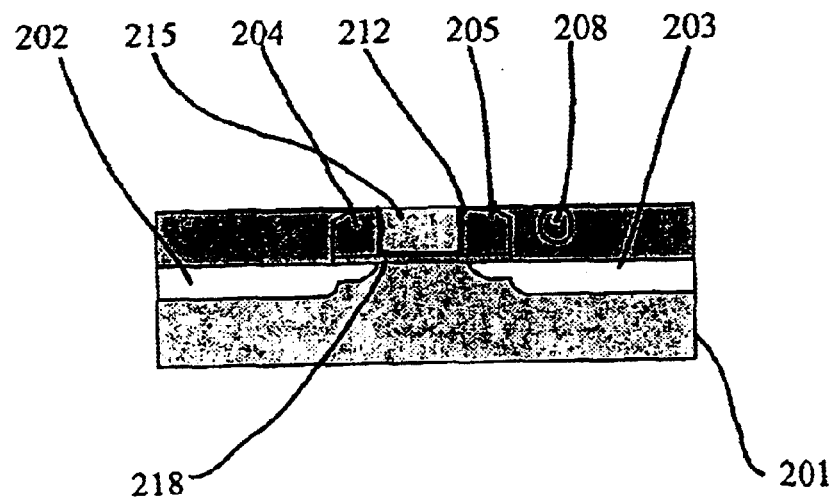
FIG. 2 is a cross section of a CMOS transistor having a metal gate formed from a damascene/CMP process.
Figure 3:
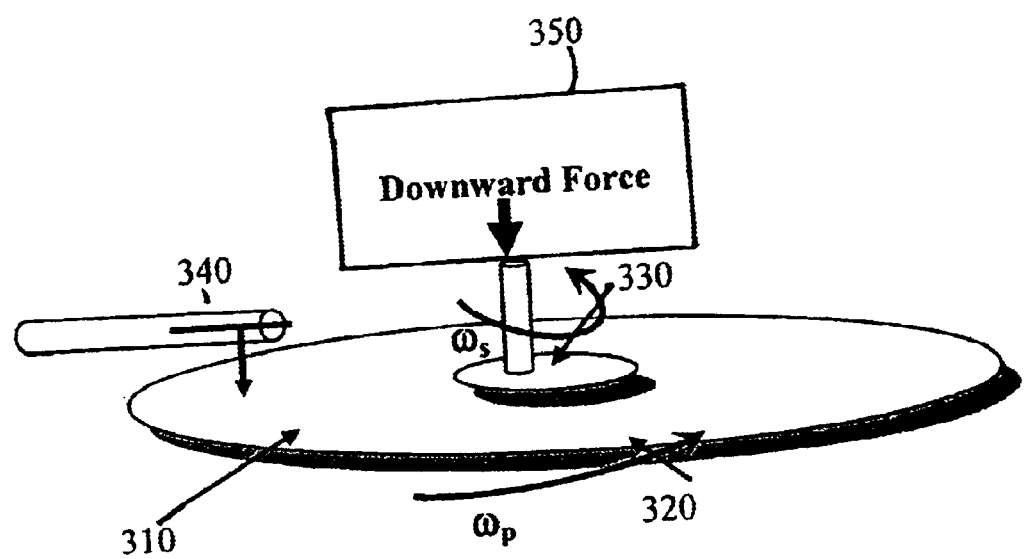
FIG. 3 is a perspective view of a conventional CMP polisher.

The invention relates to a slurry and method for chemical-mechanical polishing (CMP) of a copper or silver or alloy film including either of these materials. Copper and silver are known to share similar mechanical and chemical properties. Silver has excellent electrical conductivity and has high electromigration resistance in a surface coated form which makes it an ideal candidate for interconnect applications. Silver can also be used as a single or multilayer electrode material in applications where Cu is now commonly used, such as those involving CMOS, FeRAM, and TMR and related devices.

The terms copper or silver and copper or silver containing alloys are hereinafter collectively referred to as a "copper or silver film." A copper or silver film is also understood to represent structures which have different underlying layers, such as pure copper and copper containing alloys, Ti/TiN/Cu, Ta/Cu, TaN/Cu, WN/Cu and X/Cu, where X is Pt, Ir or W. The barrier metal can comprise any refractory metal, as well as refractory metal compounds, such as oxides and nitrides.

It should be noted that the invention is also applicable for CMP of materials which share similar mechanical and chemical properties to that of copper and silver. Thus, in all applications where copper is currently being used or planned for use, it is generally possible for other metals to replace copper. Accordingly, references and examples herein relating to the CMP of copper films should be understood to include CMP of materials which share similar mechanical and chemical properties to that of copper and silver.

The invention can be used to polish a copper film for a variety of semiconductor production processes, such as a CMOS or BiMOS process. The copper or silver film can be used for device interconnection or as a part of the gate electrode structure for transistor-based semiconductor devices. The copper or silver film can either be a single layer or one of multiple metal layers between insulating materials, or in a multiple metal layer stacked structure. As a gate electrode, copper or silver films which can be provided by the invention can be used for replaceable gate transistors in front end device technology, for making new types of memory devices such as ferroelectric device RAMs and high-K DRAM structures. The invention can be applied to various circuit substrates, such as silicon, gallium arsenide and indium phosphide, silicon carbide and sapphire.

A slurry includes at least one chemical which either directly, or indirectly through the formation of one or more reactants, reacts with the copper or silver film to form a soft layer on the surface of the copper or silver film. The slurry solution can be either aqueous or nonaqueous. Nonaqueous solvents can include acetonitrile ($CH_3CN$), Tetra-Hydro-Furan (THF) and Dimethylsulfoxide (DMSO).

The soft surface layer has a hardness less than the copper or silver film. The invention may be contrasted with conventional copper CMP slurries which form a copper oxide ($Cu_2O$) layer on the surface of the copper during the CMP process. Copper oxide is known to have a hardness (Mohs hardness of 3.5 to 4) substantially greater than copper films (2.5 to 3), or common underlying dielectric layers.

The invention substantially overcomes problems associated with copper CMP. Specifically, the formation of a soft surface layer having a hardness less than the copper film permits a reduction in dishing, erosion, surface scratching, peeling, and also a reduction in the polishing of underlying layers.

In a preferred embodiment, the soft layer formed is a copper or silver halide layer, such as copper iodide (CuI) or silver iodide (AgI). Halides may be added directly to the slurry or formed from an in-situ reaction process in the slurry solution. Although slurry particles are not required, if slurry particles are used, the particles selected are preferably softer than the copper or silver film and the underlying insulating layer. As a result, the slurry particles used will not substantially scratch the underlying materials.

The reactive chemical in the slurry forms a passive and easily removable soft layer on the surface of the copper or silver film when the slurry contacts the copper or silver film. Whether the soft layer will form on the copper or silver surface can be predicted by determining the Gibb's free energy for the reaction in question. If the Gibb's free energy of the particular reaction is negative, the reaction will generally occur spontaneously. Reactants other than iodine containing chemicals such as $I_2$, HI, $KIO_3$, can be added to the slurry to form soft layers other than CuI or AgI. Examples of some reactive chemicals that can be used to form soft layers other than CuI or AgI include bromine, fluorine, sulfuric acid, hydrochloric acid, carbonic acid and nitric acid. These chemicals are generally added in the concentration range of from about 0.1 mM to 1 M.

Thus, reactants can be used to form copper or silver iodide, copper or silver bromide, copper or silver fluoride, copper or silver sulfide, copper or silver chloride, copper or silver carbonate and copper or silver nitrate layers on the surface of the copper or silver film. These materials are all softer than copper or silver, or common alloys of the same. Other reactants which form copper or silver compounds that are softer than copper or silver may also be added to the slurry.

Besides the use of halides, other chemicals including calcium chloride, and sodium bicarbonate can be used to form a soft surface layer. These and related chemicals are chosen so that non-oxide and mixed oxide layers are formed on the copper or silver surface.

The rate of formation of the soft layer generally depends on factors such as the concentration of the reactive chemical, the rate of transport of the reactive chemical to the surface of the copper or silver, the pH of the slurry and the thickness of the soft layer.

The pH of the slurry can be from 2 to 12. However, an alkaline pH can result in the generally undesirable formation of copper oxide. Preferably, the pH of the slurry is from 2 to 9.

The soft layer formed is also preferably substantially insoluble in the slurry solution to limit the static etch rate by passivating the surface. The degree of insolubility of the salt can be quantified by the rate of dissolution of the film. The rate of dissolution should not generally exceed 20 nm/minute. It should be noted that the metal can still be removed by mechanically removing the insoluble surface layer by action of the polishing pad.

If the soft layer exhibits any significant solubility in the slurry, the planarity of the surface can be compromised. It is known that chlorides, iodides, carbonates, bromides of copper or silver are insoluble in most solutions, and thus have the capability to passivate the surface.

If a passivation layer is not formed on the surface of the copper or silver film, the static etching rate of copper or silver will generally be very high, which can degrade the planarity of the wafer during polishing. Similarly, the soft layer should not be formed from a corrosion reaction where reaction products are continuously dissolving the copper or silver surface.

Since the soft layer formed on the copper or silver surface from reaction with the slurry solution has a hardness less the copper or silver film, it is generally easily removable from the surface when mechanical abrasion is applied during the polishing process. Mechanical abrasion can be provided either with or without particles in the slurry. When the slurry is particle-free, the polymeric polishing pad provides the necessary mechanical abrasion when it rubs against the wafer surface.

When particles are used, it is preferred to use particles having a hardness less than that of the copper or silver film. As used herein, the term "soft particles" refers to such particles having a hardness less than the copper or silver film. If the hardness of the particles is less than the copper or silver film, scratches generally do not occur on the wafer surface independent of the concentration of particles in the slurry. Examples of particles which are typically softer than the copper or silver surface and most semiconducting insulating materials include polymer particles such as polystyrene, polytetrafluoroethylene and polyamide, metal particles such as nickel, carbon, silver and copper and inorganic particles such as porous silica.

It is expected that nano-porous materials can be expected to meet the hardness criteria of being softer than the copper or silver film. A nanoporous material is a material which has a high fraction of porous spaces. The pore size can vary from about 0.2 nm to 100 nm. Pores generally occupy greater than 10% of the material.

The concentration range for the soft particles can vary from 0.01 to 50 wt. %, depending on the ability of the particles to disperse in the particular slurry solution. A preferred soft particle concentration is generally between 1% to 10 wt. %. The size of the soft particles can vary from 0.1 $\mu$m to 100 $\mu$m. A preferred soft particle size is from 0.1 $\mu$m 50 $\mu$m. The particles can be composite particles formed from one or a plurality of polymers. Alternatively, particles can be in the form of a mixture.

It is known that larger particles generally lead to more scratching. However, when soft particles are used having a hardness less than the copper or silver film, no scratches are expected to occur on the surface of the copper or silver film. Soft particles also do not substantially remove the underlying tantalum, titanium or other refractory metal based barrier layer, thus maintaining a high selectivity of the polishing slurry with respect to the underlying layer.

Although soft particles are generally preferred when particles are included in the slurry, slurry particles having a hardness greater than the copper or silver film may also be used with the invention to obtain a higher polishing rate along with low surface defectivities, provided the hard particles are provided in a low concentration. The concentration of abrasive particles in the slurry can range from approximately 0.0001 to 2 wt. %. Preferably, the abrasive particle concentration is less than about 1 wt. %.

If the abrasive particle concentration is kept low, the barrier layers, if present, such as tantalum or tantalum containing alloys such as tantalum nitride, will not be substantially polished by the slurry after the copper or silver overburden layer is removed. However, if the concentration of the hard abrasives is higher than about 2 wt. %, the removal rate of barrier layers such as tantalum can become high and lead to non-uniformity of the surface.

The size of the hard abrasive particles can range from 2 nm to 5 $\mu$m, preferably being 30 nm to 500 nm. More preferably, the hard particles have sizes generally ranging from 30 nm to about 300 nm. The size refers to the primary particle and not to the aggregate size. In a typical slurry, the primary particles may not be completely separate from each other and may form soft aggregates due to Van der Waals forces. The size of these aggregates refers to the aggregate size. Thus, many primary particles may form weakly bonded aggregates in the slurry.

For example, silica, zirconia, alumina and yttria and silicon nitride are materials which have a hardness which is higher than the underlying copper or silver substrate of 2.5 to 3 on the Mohs scale. However, if abrasive particles harder than the copper or silver film are provided in sufficient concentration, significant scratching of the surface of the underlying copper or silver can occur.

Some particles, particularly soft particles, may be hydrophobic. Accordingly, to disperse hydrophobic particles in the slurry, suitable surfactants or other additives can be added to substantially overcome this problem.

A variety of surfactants can be used with the invention. Surfactants can either be cationic, anionic, zwitterionic or non-ionic. The surfactants can be used individually or in a mixed state. Details on the type of surfactants that can be used with the invention can be found in a book by M. J. Rosen, Surfactants and Interfacial Phenomena, John Wiley & Sons, 1989 pg. 3–32, 52–54, 70–80, 122–132, and 398–401 (Rosen). Surfactants are generally characterized as having a hydrophilic head group and a hydrophobic tail group. Examples of the tail groups include straight chain, long alkyl groups (carbon chain length varies from $C_8$ to $C_{20}$), branched chain, long chain ($C_8$–$C_{15}$) alklybenzene residues, long chain perfluoroalkyl groups, polysiloxane groups, hand high molecular weight propylene oxide polymers.

Examples of anionic surfactants include carboxylic acid salts, amine salts, acylated polypetides, sulfonic salts, higher alkylbenzene sulfonates, sodium dodecyl sulfate (SDS), sodium alkene sulfonate (SAS), olefin sulfonates (AOS), sulfosuccinate esters, sulfated linear primary alcohols, sulfuric acid ester salts, phosphoric amides, polyphosporic acid esters and perfluorinated anionics. Preferred anionic surfactants include SDS, SAS, and their alkali free derivatives.

Examples of cationic surfactants include long chain amines and their salts, diamines and polyamines and their salts, quaternary ammonium salts, polyoxyethylenated (POE) long chain amines, quaterized polyoxyethylenated long chain amines, amine oxides and cetyl trimethyl ammonuim bromide (CTAB) or cetyl trimethyl ammonium chloride (CTAC). Preferred cationic surfactants include dodecyl trimethylammonium bromide ($C_{12}$ TAB) and related compounds with varying hydrophobic chain length. Other preferred examples of cationic surfactants include dodecylammonium chloride and cetylpyridium bromide. In each of these cases the hydrophobic chain length can be varied from $C_8$ to $C_{20}$.

Examples of zwitterionics include B-N alkylaminopropionic acids, N alkyl-B iminodipropionic acids, imidazoline carboxylates, N-alkylbetanies, amine oxides, sulfobetanies and DAPRAL® variants, such as KETJENLUBE 522®. KETJENLUBE 522® is the current tradename for what had been called DAPRAL GE 202®, now produced by the Akzo Nobel Functional Chemicals, Netherlands. This material is a water soluble copolymer of an average molecular weight of approximately 15,000 consisting of a-olefins and dicarboxylic acids, partially esterified with an ethoxilated alcohol. KENJENLUBE 522® is highly lubricating and dispersing.

Examples of non-ionic surfactants include polyoxyethlyenated alkylphenols, alkylphenol, polyoxyethlyenated straight chain alcohols, polyoxyethlyenated polyoxypropylene glycols, polyoxyethlyenated mercapatans, long chain carboxylic acid esters polyoxyethlyenated silicones, tertiary acetylenic glycols and TRITON X-100® manufactured by the Dow Chemical Corporation, MI (formerly the Union Carbide Corporation. TRITON X-100® is octylphenol ethylene oxide condensate and is also referred to as OCTOXYNOL-9®. This material has a molecular weight of 625 amu.

Preferred examples of non-ionic surfactants include TWEEN-80™ and the family of TRITON X® compounds, TWEEN-80™ is manufactured by the ICI group of companies, New Castle, Del. TWEEN 80® is polyoxyethylene sorbitan monooleate, and has the following synonyms: TWEEN 80®1,polyoxyethylene sorbitol ester, polysorbate 80 and PEG (20) sorbitan monooleate. This material has the molecular formula $C_{64}H_{124}O_{263}$ and a corresponding molecular weight of 13103 amu.

In each of these surfactants the head group and the tail group can be varied to provide similar effects in the slurry but at different concentration levels. In certain cases it may be advantageous to use mixed surfactants to control the adsorption density, the strength of the surfactant adsorption. Examples of some possible synergistic effects are given in pg. 398–401 of Rosen. Additionally some salts as outlined earlier may be added which control the strength of the surfactant adsorption.

The concentration of the surfactants used depends on the type of the surfactant used, the surfaces of materials in which the slurry solution is contact with, and its bulk critical micelle concentration (CMC) value. At low concentration, the surfactant may adsorb onto the solid surfaces in a patchy manner and change the electrostatic properties and the surface energy of the surface. The adsorption of the surfactant may reduce the etch rate of the surface layer.

At higher surfactant concentrations, the surfactant molecules may coalesce together to form self assembled structures. The bulk CMC value of the surfactant is defined as the minimum concentration at which the surfactants self assemble to form structured layers in a bulk solution. Examples of structured surfactants can include spheres, cylindrical rods, bi-layers, disks and vesicles. Once the bulk CMC is reached, the surface tension of the solution does not decrease further, but is accompanied by a rapid drop in the electrical conductivity of the bulk solution. The formation of micelles is thought to be due to the reduction in the free energy of the solution.

For the surfactants to be effective during the polishing process, they should be readily adsorbed at the interfaces of the materials which are being polished such as copper, silver and tantalum, but also to the solid particles which are present in the slurry. As in the bulk, the surfactant in the slurry can reassemble and form structured layers on the surface of the solid interfaces. In this case, the concentration at which the structured layers form is not a fixed value, but varies with the type of the materials which the solution is in contact with. Typical concentrations at which this self assembly takes place varies from 10% of bulk CMC to 500% of bulk CMC. Concentrations of 10% to 100 times the bulk CMC value have been used.

The adsorption of the surfactant and its self assembly can be measured by a combination of several techniques including FTIR (Fourier Transform Infrared Spectroscopy), Atomic Force Microscopy (AFM), adsorption density measurement via the solution depletion method, and contact angle measurements. Surface force measurements are preferably performed using AFM.

The surfactant additives described above can be supplanted or used in combination with polymeric additives such as polyethylene oxide (PEO), polyacrylic acid (PAA), polyacryamide (PAM), polyvinylalcohol (PVA), polyalkylamine (PAH) and related compounds. These polymer additives can be used as dispersants for particles in the slurry. The molecular weight of these additives can vary from 500 to 100,000 amu. The concentration of the additives can vary from 0.1 mg/liter to 10.0 g/liter.

The reaction rate at the surface can be also controlled by the addition of chelating agents or complexing agents which can bind with the copper or silver ions in the solutions and the copper or silver on the surface. Examples of the chelating agents which have been used to modify the reaction rate kinetics include EDTA, and bidentate ligands such as ethylenediamine (en), acteylacetonate ion (acac), phenanthroline (phen), and oxalates and related compounds. The concentration of these chemicals can be varied from 0.1 mM to 100 MM in the solution. The copper removal rate was found to generally increase with the addition of chelating agents.

The soft layer formed by the slurry is preferably thin, continuous and substantially non-porous to the slurry. Typically, the thickness of the soft layer formed during CMP should be from 2 nm to approximately 1 $\mu$m. This thickness refers to the dynamic thickness of the layer during CMP processing given the concurrent growth and removal processes. If polishing is stopped, the resulting soft layer thickness can be expected to increase. If the soft layer formed on the surface is too thick, generally being greater than about 1 $\mu$m, surface planarity will generally not be achieved. This is because both the high and low topographies present on the wafer surface will receive nearly the same polishing rate.

The soft layer can be removed without dislodging the copper or silver film from its underlying layers because the interface strength of the soft layer to copper or silver film is generally lower than the shear force applied to this interface by the CMP process. Thus, during the CMP process, the rubbing action of the pad or particles is able to dislodge the soft layer.

If the removal of the surface layer is not by a wear mechanism but a catastrophic failure at the interface, then the shear stress produced by the pad when it rubs the surface becomes an important parameter. Even if the surface layer is hard and cannot be indented by the pad, the layer may be removed by fracturing at the interface. For this condition, the shear stress generated by the pad action becomes an important parameter.

The shear stress supplied by the pad depends on the normal stress of the load and the friction coefficient between the pad and the wafer in presence of the slurry. The true shear stress is dependent on the contact area of the pad and the wafer and is generally difficult to accurately measure. The true contact area will also depend on the mechanical properties of the pad. Thus, as the true shear stress generally cannot be accurately measured, the nominal shear stress can be used as a metric to study the removal of the film by this mechanism. The nominal shear stress can be determined by multiplying the normal stress and the friction coefficient between the pad and the surface. The nominal shear stress applied by the pad can vary from 0.1 psi to 10 psi. The preferred value of nominal stress is from 0.1 psi to 5 psi.

If the soft layer is substantially porous, reactants in the slurry solution can diffuse through the soft layer and react with the copper or silver film. This can result in the thickness of the soft layer increasing during the time required to complete the polishing process. To ensure that the surface soft layer is non-porous and does not exceed approximately 1 $\mu$m in thickness, additives, sometimes referred to as inhibitors, can be added to passivate the soft layer. Passivating agents reduce the rate of the surface reaction by covering porous regions and the subsurface layer regions. For example, additives such as benzotriazole (BTA), imidazole, and other nitrogen containing compounds such as tolytriazole (TTA), mercaptans, oxalic acid, sodium hexanoate, carboxylic acid thiols and other derivatives of hydroxy, and amino, imino, carboxy, mercapto, and aklyl substituted groups can be used to passivate the soft layer. Preferred additives for passivation include BTA and TTA, mercaptons and thiol based compounds. Some of these additives may be recognized as also being listed as preferred surfactants herein.

A typical concentration of additives ranges from 0.0001 mM to 300 mM. Preferably, the additive concentration in the slurry is less than 100 mM. Surfactants such as SAS, CTAB, and their non-alkali derivatives can also be used with the above passivation inducing additives.

The copper or silver film for polishing may include some contamination at the film surface or inside the grain boundaries of the copper or silver film. Examples of contamination include formation of a thin native copper or silver oxide layer from exposure to air, formation of copper or silver oxide at grain boundaries, and presence of carbon-based impurities from the deposition of the copper or silver film. If a copper or silver oxide layer or carbon-based impurities are present on the surface or inside the copper or silver grain boundaries, it may become necessary to alter the CMP process conditions noted above.

Certain etchants can be added to the slurry to remove thin copper or silver oxide layers or carbon based impurities from the copper or silver film. Chemicals that can slowly etch oxide layers may be added to the CMP slurry. Examples of these etchants include nitric acid, acetic acid, sulfuric acid, hydroxy acid, carboxylic acid, citric acid, malic acid, malonic acid, succinic acid, phtalic acid, EDTA, tartaric acid, dihydroxysuccinic acid, lactic acid, malic acid, fumaric acid, adipic acid, glutaric acid, oxalic acid, benzoic acid, propionic acid butyric acid, valeric acid and their salts. The preferred etchants include citric, succinic, tartaric and acetic acid. Addition of these acids helps ensure that the copper or silver oxide or carbon based impurities are eliminated during the polishing step so that the predominant species becomes the soft surface layer.

The acid concentration to remove the surface oxide layer or carbon based impurities is from approximately 0.0001 M to 1.0 M. The preferred acid concentration is from approximately 0.001 M to 0.05 M.

Acid etchants may be combined in the slurry with passivating additives and/or surfactants. Both the static removal rate of copper or silver and copper or silver polishing rate generally increases with the addition of the acidic etching chemicals to the slurry. In general, the surface layer formed using the invention is primarily insoluble in the slurry solution and is removed mechanically by the pad. However, if etching chemicals are added, the surface layer may be partially removed in a soluble form. Preferably, the copper or silver film removed is substantially insoluble and is substantially (>90%) removed as a solid by the mechanical process that is provided by the mechanical rubbing of the pad on the surface of the wafer. Thus, the maximum etching rate based on the removal rate should preferably not exceed 10% of total removal rate.

Etchants can also be used in a preconditioning step to clean the surface of materials such as native oxide prior to initiating polishing. When the slurry contains a low density of particles or no particles at all, the role of preconditioning the metal layer can become increasingly important. A "native" oxide layer is typically formed on the copper or silver surface prior to CMP processing, which can result in wide variability in the polishing results. The thickness of the native oxide layer depends on the conditions to which the metal wafer has been subjected. As the copper or silver oxide layer is hard, it becomes difficult to remove this layer without the application of a hard particle surface. One way to initiate the copper or silver polishing step is to clean the surface of the copper or silver with an etching chemical before initiating the copper or silver polishing step. Reagents such as EDTA, citric acid, maleic acid, acetic acid, HCl, HBr, nitric acid, and ammonium based solutions can be used for this purpose.

Salts can be added to the slurry to control the concentration of chemical reactants in the slurry solution. For example, salts such as iodides, bromides, chlorides and carbonates can be added to an iodine slurry solution to help control the CMP removal rate by controlling the reaction rate. Some examples of salts which can be used with halide reactants include KI, KBr, $KCO_3$, $NH_4I$, $KNO_3$, KCl and $NH_4Cl$.

Salts may be used in conjunction with passivating additives, such as TTA and/or surfactants. The concentration of salts is generally from 0.001 M to 1 M. The preferred salt concentration is between 0.01 M and 0.1 M.

Polishing pressure and linear polishing rate can be used to optimize CMP results. Polishing pressure is generally from 0.5 psi to 10 psi, with a preferred polishing pressure of 1.5 psi to 6 psi. The linear polish rate, which is the product of the rotation speed and the center of the wafer from center of the platen is generally from 20 ft/min to 1000 ft/min. The linear polishing rate primarily depends on the type of polisher, the size of the wafer, the diameter of the platen wheel and the angular velocity.

EXAMPLES

Example 1

Analysis of a Soft Surface Layer Compared to a Copper Oxide Layer

Figure 4:
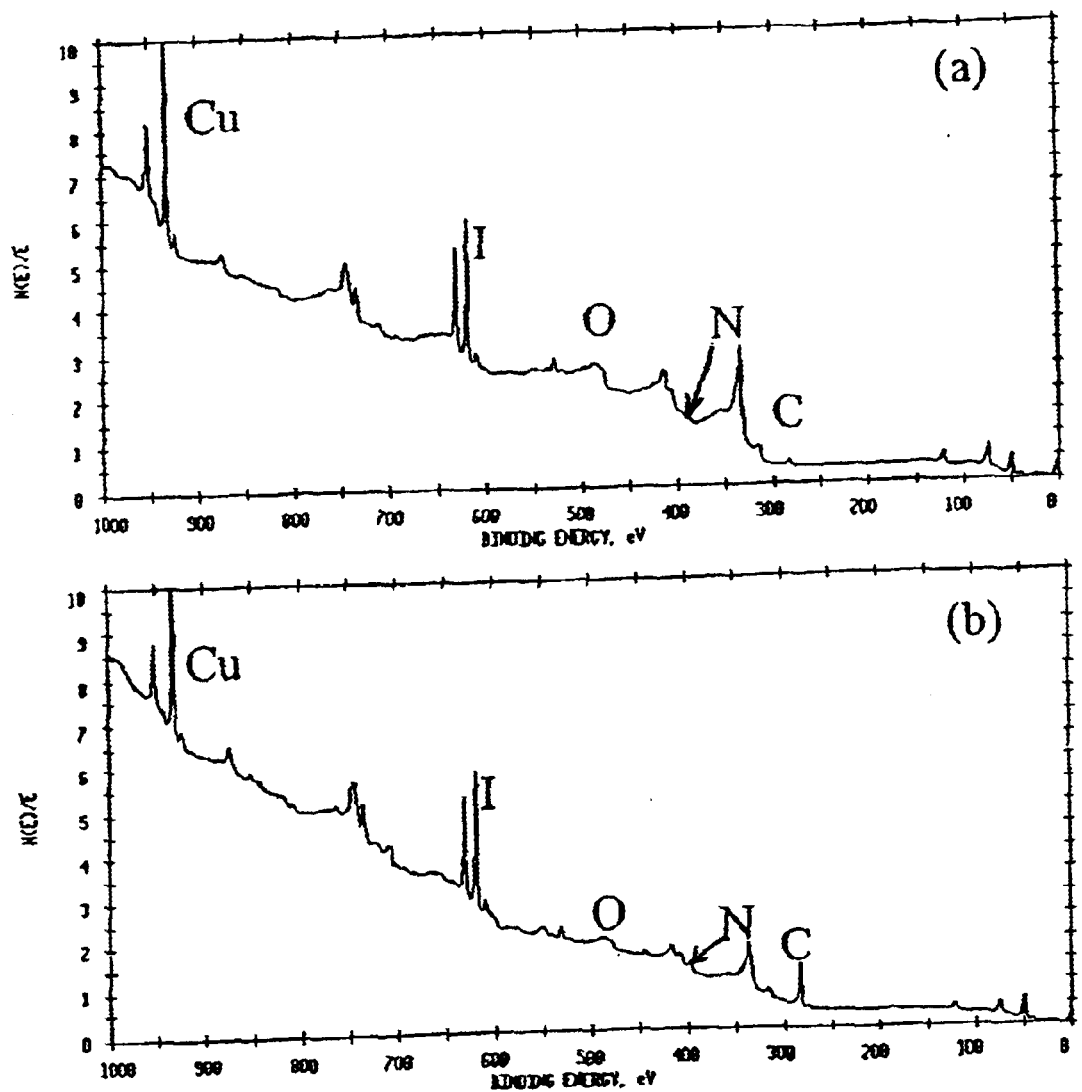
FIGS. 4(a) and 4(b) are X-ray photoelectron spectroscopy (XPS) data from the surface of copper after dipping in iodine solutions having no BTA and 10 mM BTA, respectively.

To determine the composition of soft surface layers formed using the invention, the surface of a copper film was dipped in a solution containing 0.01 N iodine to form a CuI surface layer. FIG. 4(a) shows X-ray photoelectron spectroscopy (XPS) data from the surface of the copper layer after being immersed in the iodine solution which was maintained at pH of 4.0. The XPS technique is a highly surface sensitive technique which can be used to determine the composition of various layers. The XPS results show that a layer of CuI is formed on the surface of the copper film. Peaks of copper, iodine and oxygen (contaminant) are observed in the spectra shown. The oxygen peak detected is contamination formed when the copper film is exposed to an oxygen containing atmosphere.

A copper iodide (CuI) layer is also formed when other passivation inducing additives, such as BTA, are added to a solution containing 0.01 N iodine and maintained at pH 4.0, as shown in the (XPS) data provided by FIG. 4(b). Thus, a layer of copper iodide can be formed on the copper surface even in the presence of passivation inducing additives such as BTA.

FIG. 5(a) shows a SEM micrograph of the surface after a copper coated silicon wafer which was dipped in a solution containing 0.01 N iodine. The solution was maintained at a pH of 4.0. In FIG. 5(a), the formation of a granular copper iodide layer is shown which is relatively thick, being in the range of less than 1 µm. The layer appears to be continuous. However due to its apparent granular nature, the layer shown in FIG. 5(a) may be porous and as a result susceptible to a continuous chemical reaction.

FIG. 5(b) shows a SEM micrograph of a surface formed using a solution containing 0.01 N iodine and 10 mM of BTA, the solution maintained at a pH of 4.0. In contrast to the layer shown in FIG. 5(a), the copper iodide layer formed after the addition of BTA shown in FIG. 5(b) appears smoother and thinner. This can be explained by BTA passivating the copper iodide surface and preventing further reaction between iodine and the underlying copper film. Thus, additives can be used to control the thickness, texture and the passivation characteristics of the soft surface layer formed.

Figure 6:
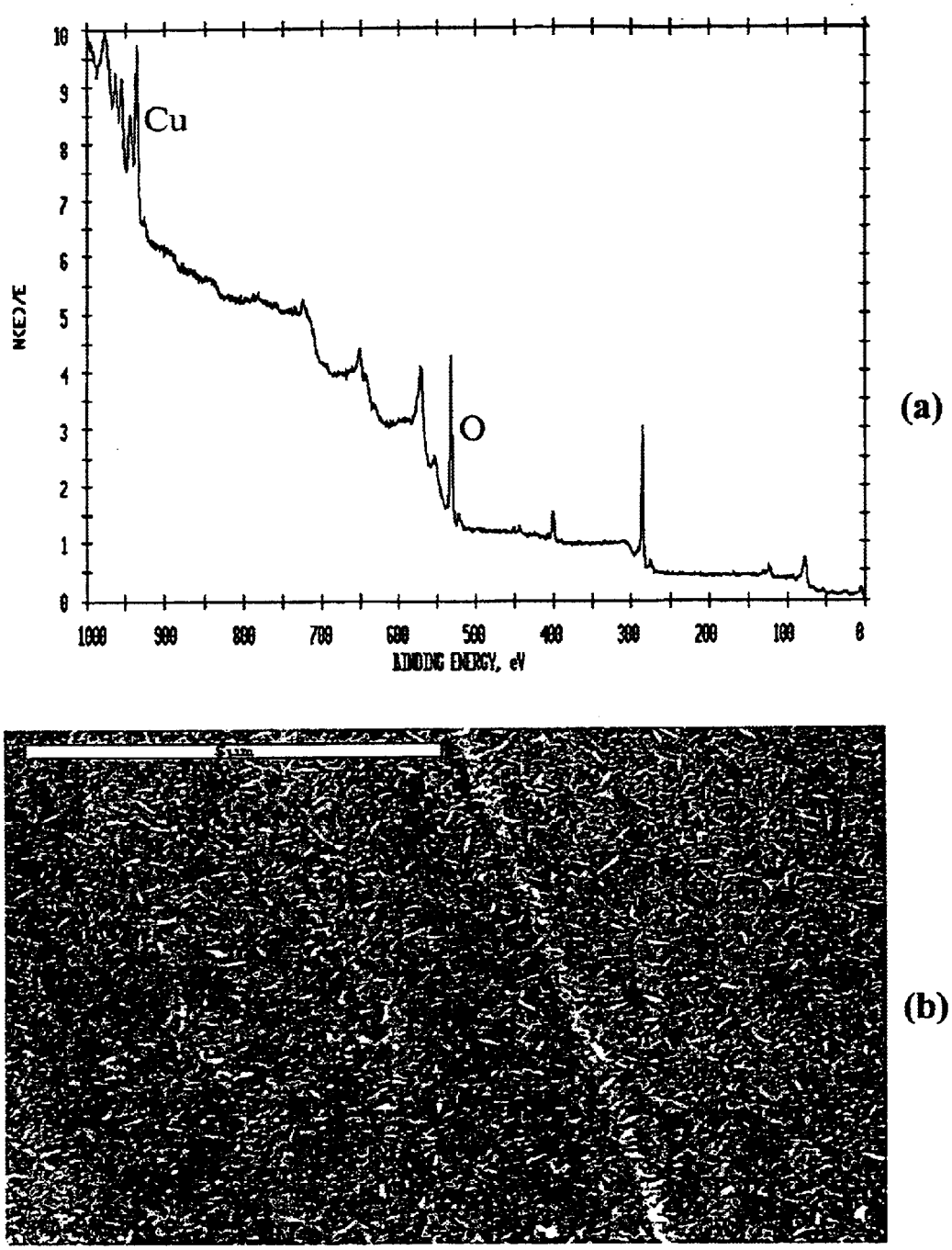
FIGS. 6(a) and 6(b) are XPS and SEM micrographs, respectively, showing the formation of a copper oxide layer on a copper wafer after dipping the copper wafer in an oxidizing solution of 10% $H_2O_2$.

Use of oxidizers such as hydrogen peroxide, potassium iodate and potassium ferricyanide in a slurry generally lead to the formation of a copper oxide layer, which is typically hard and difficult to remove from the surface. A copper coated wafer was dipped in a 10% hydrogen peroxide solution at pH 8.0. FIG. 6(a) shows XPS results confirming the formation of a copper oxide layer. The copper oxide layer is typically thick, hard and difficult to remove in absence of a hard abrasive on the surface. The SEM micrograph shown in FIG. 6(b) shows that the copper oxide layer forms a thick, rough surface.

Example 2

Effect of Concentration of Iodine and Comparison with Effects from Use of Hydrogen Peroxide This example shows the removal characteristics of a copper film as a function of the concentration of iodine in a solution. As shown in FIG. 7, the concentration of iodine in the solution was varied from 0.001 N to 0.1 N. To facilitate removal of native copper oxide 0.13 M citric acid was added to the solution. No particles were added to the solution. The experiments were conducted using a pad pressure of approximately 2.7 psi, a pH of 4.0 and a linear velocity of approximately 253 ft/min.

At low iodine concentrations, such as 0.001 N, the removal rate of copper was only 53 nm/min. At an iodine concentration of 0.01 N, the removal of copper was 775 nm/min. The copper removal rate increased to 2716 nm/min when 0.1 N $I_2$ was used. Thus, the copper removal rate increased substantially as the iodine concentration was increased from 0.001 N to 0.1 N. It can be expected that by varying the iodine concentration of a slurry solution from 0.0001 to 1 N, a wide range of copper (or silver) polishing rates can be obtained.

In addition, the surface roughness of the resulting copper surface was approximately 1 to 2 nm rms with no scratches detected. This indicates that the resulting surface was polished during the CMP process. Lack of scratches to the copper surface demonstrates reduced defectivity obtainable using the invention.

The polishing rate of tantalum using the same iodine solutions was also measured. The tantalum polishing rate was generally less than 0.2 nm/min, producing a Cu/Ta selectivity of 4000 or greater for iodine concentrations of 0.01 N and 0.1 N.

The above results were compared with results obtained using slurries containing an oxidizing chemical that forms a copper oxide ($CU_2O$) layer rather than a copper halide, under otherwise equivalent conditions, including the use of no abrasives. FIG. 8 shows the copper polishing rates obtained from solutions containing 0.1%, 1% and 10% hydrogen peroxide at a pH of 8 and a pad pressure of approximately 2.7 psi. The removal rate under these conditions was less than About 6 nm per minute, indicating that the hard copper oxide layer was not polished significantly when no abrasives were included in the slurry solution. Even with the addition of 0.1 M citric acid the copper polishing rate was less than 50 nm/min.

Additionally, the surface roughness of the copper oxide surface was determined to be generally greater than 4 nm. The as-received wafers may contribute to the surface roughness after polishing. However, most of the surface roughness measured can be attributed to the formation of rough flake-like material on the copper oxide surface due to action of hydrogen peroxide. Thus, the use of hydrogen peroxide does not represent an optimum solution.

Example 3

Effect of Pressure

Copper polishing was conducted at varying pressures, with a slurry solution having a fixed iodine concentration of 0.013 N. The other additives in the solution were 0.1 M acetic acid, 0.15 M citric acid and 5 mM BTA. The polishing pressure was varied from 0.5 psi to 10 psi. The linear polish rate was held at 253 ft/min. The pH was held constant at 4.0.

Results shown in FIG. 9 indicate that the copper removal rate increases with increasing pressure, but it does not increase linearly as expected for conventional slurries. The removal rate increases in a very rapid manner with pressure and then saturates if further pressure is increased.

FIG. 9 also shows that the surface roughness can be controlled by polishing pressure, permitting the planarity of the copper film to be optimized. The surface roughness of the copper films was less than 1.5 nm for a pressure of 4.3 psi, indicating the formation of a smooth surface. Under all pressures tested, the selectivity of Cu/Ta was greater than 2000.

Example 4

Effect of pH

The pH of the slurry can also be a significant parameter affecting CMP results for copper films. FIG. 10 shows the effect of varying pH using a slurry solution including 0.01 N iodine along with a 0.1 M citric acid solution for removing the native oxide layer. The pH was varied from 4 to 12. The pressure applied to the sample was 6.7 psi, while the linear velocity was 253 ft/min.

The removal rate of copper was high in the pH range of 4 to 8 (>900 nm/min), but began diminishing at increasingly alkaline pH. This reduced polishing rate can be attributed to the formation of the copper oxide layer in the basic solution under high pH conditions. Copper oxide ($Cu_2O$) and copper II oxide (CuO) are known to be generally difficult to remove from the wafer surface without using abrasive particles in the slurry.

Example 5

Effect of Polymeric Particles

Soft particles may be used in the slurry. It was found that if the hardness of the particles in the slurry are lower than copper, the surface defectivity of copper is not increased by the polishing process. In this example, the concentration of polystyrene particles was varied in an iodine based slurry, the solution containing 0.01 N iodine, 1 mM BTA and 10 mM SAS. The pad pressure was 2.7 psi and a pH of 4 was maintained. SAS is an anionic surfactant which stabilizes the polymeric particles.

The concentration of polystyrene particles was varied in the slurry from 0.5% to 30 weight %. FIG. 11 shows that the polishing rate of the slurry increases with the addition of polymeric particles, and increases with increasing concentration of polymeric particles in solution. The particle size of the polymeric particles used in this example was in the range from 0.05 µm to 50 µm.

Example 6

Use Hard Abrasive Particles

The copper polishing rate of a slurry, including slurries containing halides such as iodine, can be increased by adding hard abrasive particles, such as silica, alumina, zirconia, magnesia and other inorganic particles. By using a low concentration of abrasive particles, such as 0.001% to 1% by weight, low surface defectivities can be obtained along with the higher polishing rates provided by the addition of abrasive particles.

The slurry solution included 0.005 N $I_2$ and 10 mM BTA. Inorganic particle concentrations in the slurry varied up to 1 wt. %. The pad pressure was 2.7 psi. Particle sizes used were from about 5 nm to 2 microns.

FIG. 12 shows the polishing rate increases substantially with the addition of abrasive particles in the iodine based slurry. However, Cu/Ta selectivity of the slurry also decreases with increasing abrasive particle concentration. Thus, in the case of the iodine based slurry, the concentration of the abrasive particles should generally be less than approximately 1 wt. %, preferably being less than 0.1 wt. %.

Example 7

Use of Passivating Additives and Surfactants

The thickness of the surface modified layer formed in the process is preferably thin, such as in the 2 nm to 1 µm range. If the soft surface layer is too thick, the planarity of the process can be compromised.

The soft layer thickness can be limited by adding at least one passivating additive to the iodine containing slurry to inhibit the copper reaction rate with the chemical reactant included in the slurry, such as iodine. The resulting CMP polishing characteristics were determined using a slurry solution including a surfactant, such as SAS, CTAB, TRITON X-100®, TWEEN-80®, and passivating additives, such as BTA, TTA mercaptans and thiols.

The CMP polishing characteristics shown in FIGS. 13(a), (b) and (c) were obtained using an iodine containing slurry having a pH of 4, using various inhibitors and surfactants with an applied pressure to the sample of 2.7 psi. The iodine concentration was 0.01 N and 0.03 M citric acid was added to help remove the native oxide on the surface.

FIG. 13(a) shows that the CMP polishing rate in an I2 containing slurry decreases substantially with the addition of BTA or TTA passivating inhibitors. Similar results are shown in FIG. 13(b) when either SAS or TRITON X-100® surfactants are added to the iodine slurry.

FIG. 13(c) shows the static removal rate of a copper film in an iodine solution without inhibitors, with BTA, and with SAS, as a function of pH. BTA is seen to significantly reduce the static removal rate as compared to no additive, while SAS results in only a modest reduction in the static removal rate. The high static removal rate is seen to occur when the slurry results in a comparatively rapid rate of a copper iodide formation.

Example 8

Addition of Other Salts

The effect of addition of salts on copper CMP was investigated. FIG. 14 shows the effects of the addition of KI and $NH_4Cl$ on the copper CMP polishing rate. The test wafer had a copper film which was polished at 2.7 psi using a slurry solution which included 0.01 N iodine, and 10 mM TTA and 0.02 M citric acid. TTA was added as a passivating additive to control the reaction rate of the chemical reaction which produces CuI. The concentration of salts was varied from 0.001 M to 0.1 M. FIG. 14 shows that KI and $NH_4Cl$ can modify the polishing rate. However, the polishing rate obtained was less than about 100 nm/min. Other additives, such as $NH_4I$ can also be used for this purpose.

Example 9

Addition of Weak Acids

The exposure of copper coated wafers to ambient conditions before loading into a CMP chamber can lead to the formation a thin copper oxide layer on the surface of the film. Also, oxygen can be present during the copper growth process which can lead to the formation of a hard surface layer. Since copper oxide is a difficult material to remove, when no particles are added to the slurry, additives can be added to remove the thin copper oxide layer on the surface.

Several additives such as acetic acid, citric acid, tartaric acid, aminoacetic acid, HCl and nitric acid were investigated. It was found that the concentration of these additives to remove the surface oxide layer was approximately 0.0001 M to 0.1 M.

FIG. 15 shows the CMP polishing rate of a copper film in a solution including 0.01 N iodine with 10 mM of BTA and varying concentrations of succinic acid or citric acid. The pad pressure used was 2.7 psi. The acid concentration was varied from 0.1 M to 0.2 M. An inhibitor, such as BTA or TTA in a concentration of 5 mM was also added to the slurry solution. Without the addition of the acid, the polishing rate was below 60 nm/min. The addition of citric acid significantly increased the polishing rate. For example, using 0.1 M citric acid, the polishing rate was 295 nm/min, and rose to 433 nm/min when 0.2 M citric acid was provided. This evidences that acids, such as citric acid, can aid in the dissolution of the insoluble copper iodide layer, besides removing the native oxide on the copper surface.

It is noted that the static removal rate of the copper layer also increases to 11 nm/min for a 0.1 M citric acid addition. The static copper removal rate increases to 18 nm/min for 0.2 M citric acid. This suggests that, if used in the slurry solution, the concentration of citric acid should be limited to control the static etch rate.

The static removal rates of copper was found to increase with the addition of acidic etching chemicals. The copper polishing rate was also found to increase with the addition these chemicals. However, even with the addition of acids the etching rate was less than about 20 nm/min.

Example 10

Shear Stress Effect

Experiments were conducted using between 1.5 psi and 10 psi for polishing of copper films in a 10 mN iodine solution using a Rodel IC 1000 polishing pad. No particles were used in this slurry. The friction coefficient determined under this condition was found to be varying from 0.05 to 0.80, depending on the rotation speed of the platen. The copper film removal rate was found to vary from 120 nm/min to 600 nm/min. The nominal shear stress calculated thus varied from 0.075 psi to 8 psi.

Example 11

Selectivity with Silicon Dioxide

Experiments were conducted to study the selectivity of copper polishing with silicon dioxide and other low K dielectric layers. A low K dielectric material is defined as a material which has a dielectric constant less than silicon dioxide (4.0). The low K material used in the experiments was Black Diamond®, a doped silicon dioxide, manufactured by Applied Materials, Santa Clara, Calif. Other low K dielectric materials include porous silica and specific polymers.

The slurry used in the experiments included 10 mN of iodine with 5 mM of BTA and 5 mM citric acid. The experiments were conducted at a polishing pressure of 2.7 psi and a linear velocity of 253 feet per minute. Under these conditions the polishing rate of copper was 500 nm/min, the polishing rate of silicon dioxide was 0.5 nm/min, the polishing rate of the low K Black Diamond TM material was 0.8 nm/min. Thus, the copper/low K dielectric polishing rate selectivity was thus 635, while the copper/silicon dioxide selectivity was greater than 1000.

Example 12

Selectivity with Alumina

Experiments were conducted to study the selectivity of copper polishing with an alumina dielectric layer. The slurry used in the experiments included 10 mN of iodine with 20 mM of BTA and 100 mM of citric acid, no added particles and was at a pH of 4. The experiments were conducted at a polishing pressure of 2.7 psi, a linear velocity of 253 feet per minute. Under these conditions the polishing rate of copper was at least about 100 nm/min, while the polishing rate of alumina was less than about 0.5 nm/min. Thus, the copper/alumina polishing rate selectivity was at least 200.

Example 13

Effect of Preconditioning

Experiments were performed to evaluate the use of a preconditioning step prior to polishing. Examples of results obtained are shown in the table below. This table shows the effect of dipping time (5 minutes to 30 minutes) of copper wafers in a 0.1 M citric acid solution, a 3% nitric acid solution, and a KOH solution having a pH of 13, on the CMP removal rate. Other examples of preconditioning agents include hydrochloric acid, hydrofluoric acid and EDTA. For the CMP process, 10 mN iodine, 5 mM citric acid, and 10 mM BTA at a pH 4 of was used. The pad pressure used was 6.7 psi. If no preconditioning step was used the polishing rate was approximately 40 nm/min (not shown). With a preconditioning step, the removal rate of copper was significantly increased. The most substantial change was obtained by the addition of 0.1 M citric acid where the polishing rate exceeded 200 nm/min. Thus, the addition of a specific precleaning step can significantly enhance the CMP polish rate.

| | Pre-Cleaning Solution | | | | | | | | |
|---|---|---|---|---|---|---|---|---|---|
| | 0.1 M Citric Acid | | | pH 13 Solution | | | 3% $HNO_3$ | | |
| Dipping Time (min) | 5 | 10 | 30 | 5 | 10 | 30 | 5 | 10 | 30 |
| Removal Rate (nm/min) | 274.5 | 218.0 | 230.0 | 83.1 | 53.7 | 70.9 | 75.6 | 59.6 | 89.9 |

Example 14

The Use of Halide Chemistries on the Polishing of Silver

A wafer coated with a silver layer was dipped in a 10 mN iodine solution at a pH of 4. FIGS. 16(a) and 16(b) each include SEM and EDX data showing the formation of a silver iodide layer after dipping a silver coated wafer in the iodine containing slurry. A thin continuous layer is formed at the surface as shown in each of the SEMs. The grain size is about 0.4 microns, or less. The AgI layer can be seen to entirely cover the surface.

The energy dispersive X-ray spectroscopy (EDX) spectra evidence the formation of the silver iodide layer. As the thickness of the AgI layer is much less than the depth of X-ray production, the relative intensities of the iodine peak is much smaller than the silver peak. The nature of the surface layer changes with the addition of passivating agents. Examples of some passivating agents include the surfactants outlined earlier, such as BTA, TTA, mercaptans and thiols.

The SEM micrograph and EDX spectra shown in FIG. 16(b) demonstrates that the size of the AgI grains and the thickness of the surface layer substantially decrease by the addition of the BTA passivating agent. The grain size of the surface layer is typically less than 0.25 microns. The decrease in the iodine intensity in the EDX spectra (compared to the EDX spectra shown in FIG. 16(a)) suggests that the thickness of the surface layer has also decreased. Other passivating agents such as surfactants, thiols, mercaptans and polymer additives can be used to modify the structure and thickness of the surface layer.

Polishing experiments were also conducted on silver films under a wide variety of conditions as employed for copper films. Results showed that the Ag polishing rates were in the range of 30 nm/min to 1500 nm/min, clearly demonstrating that the copper slurry chemistries can be applied to silver polishing.

Example 15

Effect of other Halides

Experiments were performed to evaluate the polishing of copper in halide such as bromine solutions. In one experiment, a 0.01 M bromine solution with 5 mM of BTA was prepared. Polishing was conducted at 6.7 psi with a polishing platent velocity of 252 ft/min. A stacked Suba IV/IC 1000 PAD was used. A polishing rate exceeding 1000 nm/minute was obtained. This high polishing rate was attributed to the rapid rate of reaction between the surface and the polishing medium. However, compared to iodine, the surface finish produced from the bromine containing slurry degraded.

The effect of hydrogen bromide and hydrogen iodide on the polishing effects in copper was also tested. 0.1 M solutions of HBr with 12 mM of BTA, and Hi with 12 mM of BTA were prepared for CMP polishing. The polishing pressure used in these experiments was 6.7 psi. For both solutions tested the removal rate was found to be less than 50 nm/min. Thus, it was determined that is possible to polish copper halides other than copper iodine. However, the polishing rate was found to be significantly less than that obtained from iodine based slurries.

Example 16

Formation of other Non-oxide Surface Layers

Besides the use of halides, other chemicals including acids such as hydrochloride, calcium chloride, and sodium bicarbonate were evaluated for their polishing characteristics. These and related chemicals were chosen so that non-oxide and mixed oxide layers could be formed on the copper surface. The experiments were conducted in different non-halide surface layer forming chemicals chemicals in the concentration range of 0.01 to 0.1 M in the presence of a 10 mM BTA additive. Polishing rates of less than 100 nm/min were obtained by using these chemistries. Thus, it is possible to polish the surface when the surface layer is transformed to other non-oxide compounds.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A slurry for chemical mechanical polishing (CMP) of a copper or silver containing film, comprising:
    a solution including a chlorine, bromine or iodine salt and at least one species selected from the group of diatomic VIIA elements consisting of a $I_2$, $Br_2$ and $F_2$ for reacting with said copper or silver film to form a soft layer on a surface of said film, said soft layer having a hardness less than said copper or silver film.

2. The slurry of claim 1, wherein said diatomic VIIA element comprises $I_2$.

3. The slurry of claim 2, wherein a pH of said solution is >9.

4. The slurry of claim 1, wherein said slurry includes a plurality of soft particles.

5. The slurry of claim 4, wherein said plurality of soft particles comprise polymer or nano-porous particles.

6. The slurry of claim 5, wherein said plurality of soft particles comprise at least one selected from the group consisting of polystyrene, polytetrafluoroethylene, polyamide, silver and porous silica.

7. The slurry of claim 1, wherein said solution further comprises at least one selected from the group consisting of HI, sulfuric acid, hydrochloric acid and carbonic acid.

8. The slurry of claim 1, wherein a pH of said slurry is from 2 to 9.

9. The slurry of claim 1, further comprising at least one etchant.

10. The slurry of claim 9, wherein said etchant comprises an acid.

11. The slurry of claim 10, wherein said acid comprises at least one selected from the group consisting of nitric acid, acetic acid, sulfuric acid, hydroxy acid, hydrochloric acid, hydrofluoric acid, carboxylic acid, citric acid, malic acid, malonic acid, succinic acid, phtalic acid, tartaric acid, dihydroxysuccinic acid, lactic acid, malic acid, fumaric acid, adipic acid, glutaric acid, oxalic acid, benzoic acid, propionic acid, butyric acid, EDTA and valeric acid.

12. The slurry of claim 1, further comprising at least one nitrogen containing organic passivating additive.

13. The slurry of claim 1, further comprising at least one chelating agent.

14. The slurry of claim 13, wherein said chelating agent is at least one selected from the group consisting of EDTA, en, acac, phen and oxalate ions.

15. The slurry of claim 1, further comprising at least one surfactant.

16. The slurry of claim 15, wherein said surfactant is at least one selected from the group consisting of non-ionic, anionic, cationic and zwitterionic surfactants.

17. The slurry of claim 16, wherein said surfactant is at least one selected from the group consisting of SDS, SAS, CTAB, octylphenol ethylene oxide condensate and polyoxyethylene sorbitan monooleate, a water soluble copolymer of an average molecular weight of approximately 15,000 consisting of a-olefins and dicarboxylic acids, partially esterified with an ethoxilated alcohol, and CTAC.

18. The slurry of claim 1, further comprising at least one polymer additive.

19. The slurry of claim 18, wherein said polymer additive is at least one selected from the group consisting of polyethylene oxide (PEO), polyacrylic acid (FAA), polyacryamide (PAM), polyvinylalcohol (PVA) and polyalkylamine (PAH).

20. The slurry of claim 1, wherein said slurry is a non-aqueous slurry.

21. A slurry for chemical mechanical polishing (CMP) of a copper or silver containing film, comprising:
    a solution including at least one nitrogen containing organic passivating additive, and $I_2$ said solution having a pH of 2 to 9 for reacting with said copper or silver film to form a soft layer on a surface of said film, said soft layer having a hardness less than said copper or silver film.

22. The slurry of claim 21, further comprising at least one surfactant.

23. The slurry of claim 21, further comprising a chlorine, bromine or iodine salt.

* * * * *